United States Patent [19]

Hamana

[11] Patent Number: 5,101,254
[45] Date of Patent: Mar. 31, 1992

[54] SCHOTTKY BARRIER SEMICONDUCTOR PHOTODETECTOR INCLUDING GRADED ENERGY BAND GAP LAYER

[75] Inventor: Takashi Hamana, Itami, Japan

[73] Assignee: Mitsubishi Denki Kabushiki Kaisha, Japan

[21] Appl. No.: 623,196

[22] Filed: Dec. 6, 1990

[30] Foreign Application Priority Data

May 24, 1990 [JP] Japan ................... 2-136440

[51] Int. Cl.$^5$ ............................................ H01L 27/14
[52] U.S. Cl. ...................................... 357/30; 357/16; 357/15; 357/90
[58] Field of Search ............... 357/15, 30 C, 30, 30 N, 357/16, 90, 30 E, 30 P

[56] References Cited

U.S. PATENT DOCUMENTS

| | | | |
|---|---|---|---|
| 4,661,829 | 4/1987 | Bean et al. | 357/30 N |
| 4,710,788 | 12/1987 | Dämbkes et al. | 357/15 X |
| 4,939,561 | 7/1990 | Yamaka et al. | 357/30 E |

FOREIGN PATENT DOCUMENTS 59-204049  11/1984  Japan ................................ 357/30

OTHER PUBLICATIONS

Lang et al., "Measurement of the Band Gap of $Ge_x Si_{1-x}$/Si Strained-Layer Heterostructures", Applied Physics Letters, vol. 47, No. 12, Dec. 1985, pp. 1333–1335.

Sze, "Physics of Semiconductor Devices", vol. 2, p. 289.

Gibbons et al., "Si/$Si_{1-x}Ge_x$ Heterojunction ... Reaction Processing", IEDM Technical Digest, 1988, pp. 566–569.

Primary Examiner—William Mintel
Attorney, Agent, or Firm—Leydig, Voit & Mayer

[57] ABSTRACT

A semiconductor photodetector includes a semiconductor layer disposed on a main surface of a first conductivity type semiconductor substrate and a metal layer producing a Schottky junction with the semiconductor layer disposed on a main surface of the semiconductor layer. The semiconductor layer has such an energy band gap in the neighborhood of the Schottky junction in a depletion layer in the first conductivity type semiconductor substrate and the semiconductor layer that no barrier to the flow of majority carriers from the metal layer to the first conductivity type semiconductor substrate is produced and a barrier to the flow of minority carriers from the first conductivity type semiconductor substrate to the metal layer is produced. Therefore, a semiconductor photodetector that suppresses the dark current caused by thermal excitation and noise in the detected signal is obtained.

7 Claims, 6 Drawing Sheets

SCHOTTKY BARRIER SEMICONDUCTOR PHOTODETECTOR INCLUDING GRADED ENERGY BAND GAP LAYER

FIELD OF THE INVENTION

The present invention relates to a semiconductor photodetector, and more particularly, to a semiconductor photodetector in which the dark current is reduced.

BACKGROUND OF THE INVENTION

FIG. 6 is a cross-sectional view showing a construction of a prior art Schottky barrier diode photodetector, which has a similar construction as that reported in "Physics of Semiconductor Devices", by S. M. Sze, vol. 2 p. 289.

In FIG. 6, reference numeral 1 designates an n type silicon substrate. A metal film 4 is produced on the n type silicon substrate 1. A constant voltage power supply 5 is provided for biasing a Schottky barrier diode comprising the silicon substrate 1 and the metal film 4. A resistor 6 is provided for converting a signal current into a voltage-signal. Reference numeral 7 designates light incident on the photodetector.

FIG. 7 is an energy-band diagram depicted along the broken line b—b' of FIG. 6. In FIG. 7, reference numeral 8 designates an energy level within the band gap due to impurities or crystal defects in the n type silicon substrate. A photo-electron 9 is excited by the incident light 7. An electron 10 is thermally excited via the energy level 8. A hole 11 is generated by thermal excitation. Reference character $I_L$ designates photoelectric current. Dark current $I_G$ is generated by thermal excitation.

The device will be operated as follows.

A photo-electron 9 excited by the incident light 7 in the metal film 4 has such a large kinetic energy that it enters the n type silicon passing over a Schottky barrier produced between the silicon substrate 1 and the metal film 4. All the photo-electrons which have entered the n type silicon are accelerated by the electric field which exists in the depletion layer and are collected at the side of the rear surface electrode on the n type silicon substrate 1. This photoelectric current $I_L$ is converted into a voltage by a resistor 6, thereby enabling an optical signal 7 to be extracted in the form of voltage signal $V_L$.

On the other hand, in a depletion layer which has spread into the n type silicon substrate relative to the Schottky junction, an electron 10 which is easily thermally excited through the energy level 8 as a stepping stone is attracted by the electric field in the depletion layer similarly as the case of photo-electron 9, and every electron 10 is collected at the side of the n type silicon substrate 1. At this time, a hole 11 is also collected at the side of the metal film 4 by means of the electric field.

In this way, a total current I at the Schottky junction is equivalent to a value which is obtained by adding the dark current $I_G$ to the photoelectric current $I_L$, that is, $$I = I_L + I_G \quad (1)$$

The dark current $I_G$ is converted into a voltage by the resistor 6 similarly as the photoelectric current $I_L$ and therefore the signal voltage $V_L$ is as follows:

$$V_L = RI = R(I_L + I_G) = RI_L + RI_G \quad (2)$$

This means that the original optical signal component $RI_L$ is combined with the dark current component $RI_G$.

A more complex circuit is required for extracting only the optical signal component $RI_L$ by removing the dark current component $RI_G$. For example, in a case where an imaging device or the like is constituted by arranging semiconductor photodetectors 15 having the above-described structure in an array configuration on a plane 16 as shown in FIG. 8 to obtain a two-dimensional image, variations in the crystallization and in the amount of impurities in the silicon substrate of respective photodetectors 15 cause differences in the dark currents of these photodetectors, thereby resulting in noise in the two-dimensional image.

Furthermore, since the dark current is generated only in the depletion layer, it increases with increased reverse bias voltage, that is, with increased depletion layer width. The dark current also increases with increased temperature.

In a case where a p type silicon substrate is used in place of n type silicon substrate, the same effects are observed when a positive voltage is applied to the metal film 4 so that a hole functions in place of an electron as described.

The prior art semiconductor photodetector constituted as described above has a problem in that the dark current operates as noise in the detected signal.

SUMMARY OF THE INVENTION

The present invention is directed to solving the above-described problem and has for its object to provide a semiconductor photodetector that suppresses the dark current caused by thermal excitation to suppress noise in the detected signal.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In a semiconductor photodetector according to the present invention, on a surface of a semiconductor substrate is provided a semiconductor layer which has an energy band gap different from that of the substrate and functions as barrier not against majority carriers but against minority carriers in the neighborhood of the Schottky junction to suppress the dark current and a metal layer is provided on the semiconductor layer.

DETAILED DESCRIPTION OF THE EMBODIMENT

An embodiment of the present invention will be described in detail with reference to the drawings.

Figure 4A:
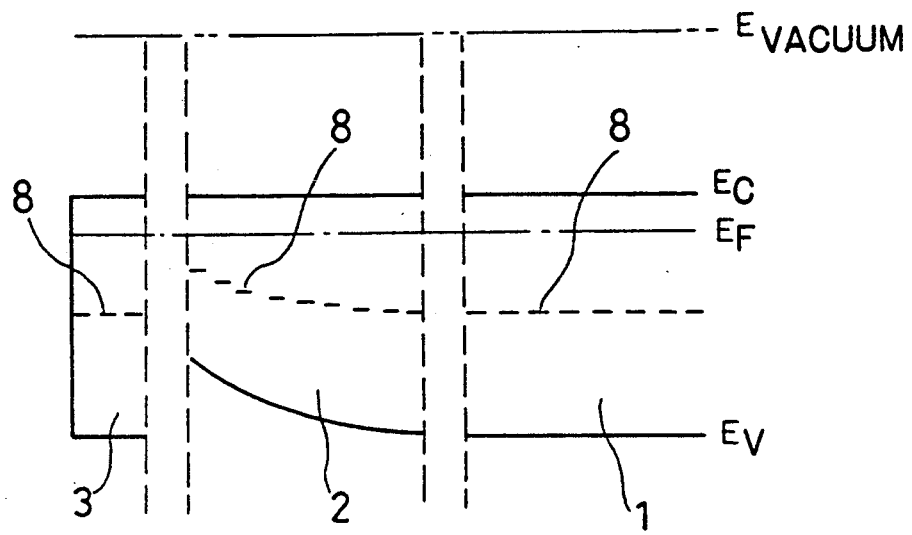
FIGS. 4(a) and 4(b) are diagrams for explaining an energy-band diagram of the semiconductor photodetector according to an embodiment of the present invention.
Figure 4B:
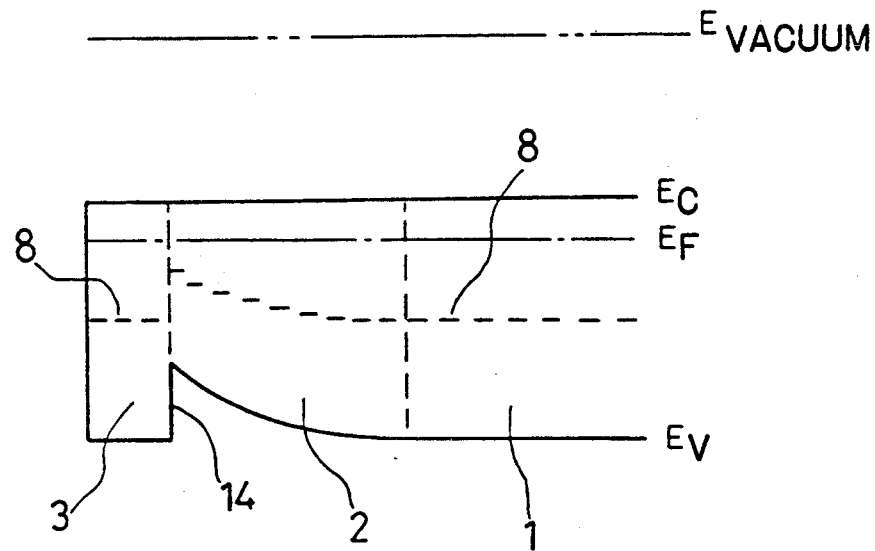

FIGS. 4(a) and 4(b) are drawings for explaining an energy-band diagram in a semiconductor photodetector in accordance with an embodiment of the present invention. FIG. 4(a) is an energy-band diagram before bringing three semiconductor regions in to contact with one another. In FIGS. 4(a) and 4(b), reference numeral 1 designates an n type silicon substrate. An n type silicon-germanium mixed crystal ($Si_{1-x}Ge_x$) layer 2 is produced by changing the composition ratio x continuously. Reference numeral 3 designates a thin n type silicon layer. Reference numeral 8 designates an energy level within the band gap.

An energy band diagram of n type $Si_{1-x}Ge_x$ 2 will be described.

Figure 3:
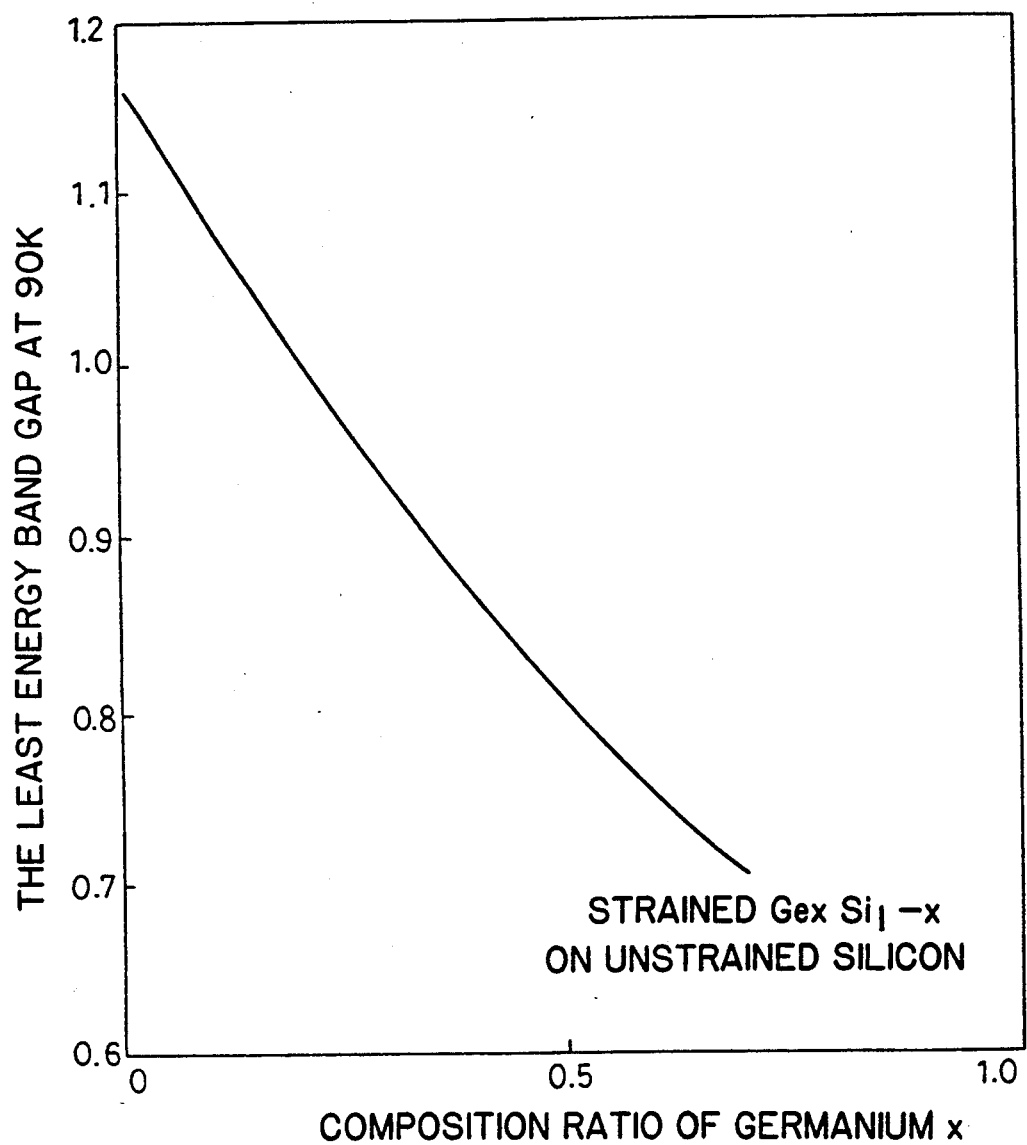
FIG. 3 is a diagram showing variation of energy band gap with respect to the composition ratio in a silicon-germanium mixed crystal.

FIG. 3 is a diagram showing the variation in energy band gap with respect to composition ratio x of $Si_{1-x}Ge_x$, which is reported in "D. V. Lang, R. People, J. C. Bean, and A. M. Sergent, 'Measurement of the band gap of $Si_{1-x}Ge_x$/Si strained-layer heterostructure', Appl. Phys. Lett., vol. 47, pp. 1333, 1985". As shown in this figure, the width of energy-band gap decreases with increased composition ratio x. Furthermore, the decrease of the energy-band gap width is not caused by the variation of the conduction band edge $\Delta E_c$ but by that of the valence band edge $\Delta E_v$, as reported in "C. A. King, Judy L. Hoyt, Chris M. Gronet, James F. Gibbons, M. P. Scott, J. Turner, 'Si/$Si_{1-x}Ge_x$ Heterojunction Bipolar Transistors Fabricated by Limited Reaction Processing', IEEE ELECTRON DEVICE LETTERS, VOL. 10, NO 2, P52, February 1989". It is found from this article that when the composition ratio x of $Si_{1-x}Ge_x$ increases, the conduction band edge $E_c$ does not vary while the valence band edge $E_v$ rises. Accordingly, when the Ge composition ratio x varies continuously in a range from zero to a certain value, the energy-band diagram in an n type silicon-germanium mixed crystal 2 of FIG. 4(a) is obtained in the configuration as shown in that figure.

FIG. 4(b) is an energy-band diagram in a case where the above-described three regions are in contact with one another. Here, an offset 14 in the valence band exists at the interface of the n type $Si_{1-x}Ge_x$ layer 2 and the n type silicon layer 3.

Figure 1:
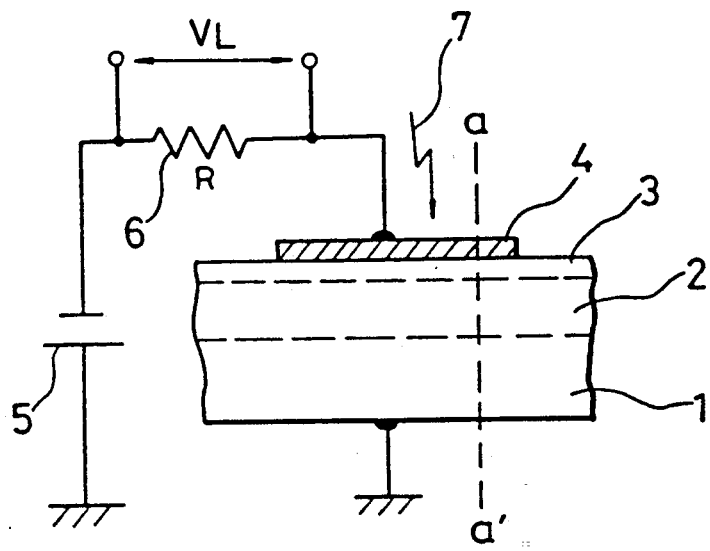
FIG. 1 is a cross-sectional view of semiconductor photodetector according to an embodiment of the present invention.
Figure 6:
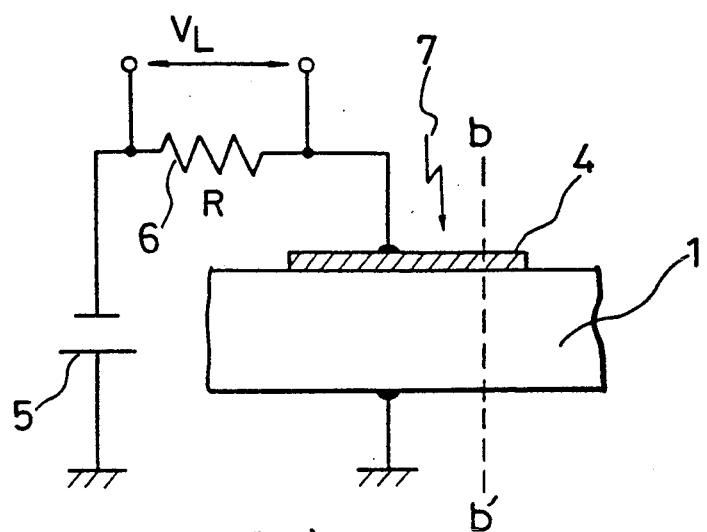
FIG. 6 is a cross-sectional view of a prior art semiconductor photodetector.

FIG. 1 is a cross-sectional view showing a Schottky barrier diode photodetector having the above-described structure. In FIG. 1, the same reference numerals as those of FIGS. 4(a), and 4(b), 6 designate the same or corresponding portions.

Figure 2:
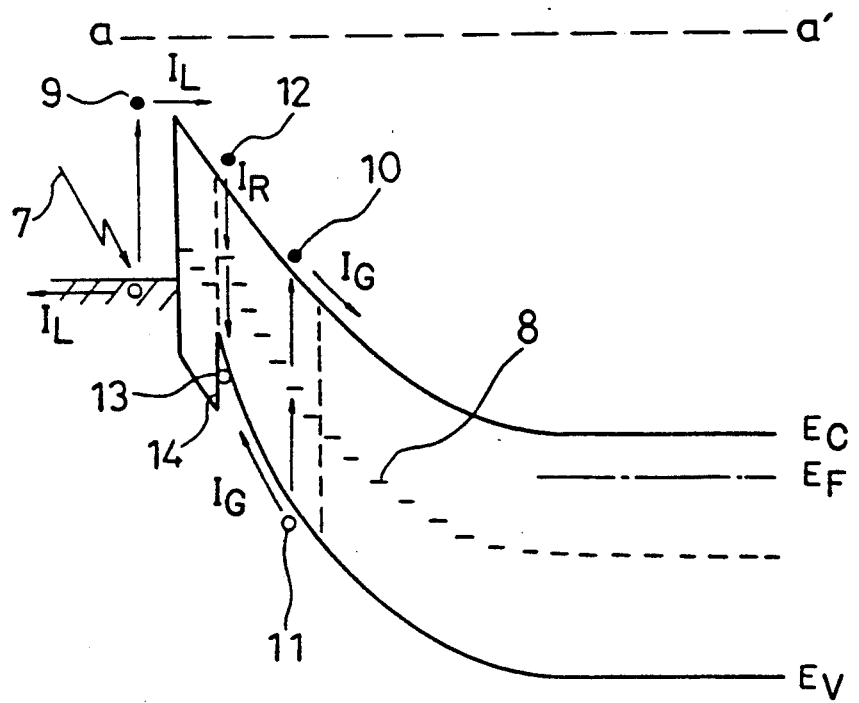
FIG. 2 is an energy-band diagram depicted along the broken line a—a' in FIG. 1.
Figure 7:
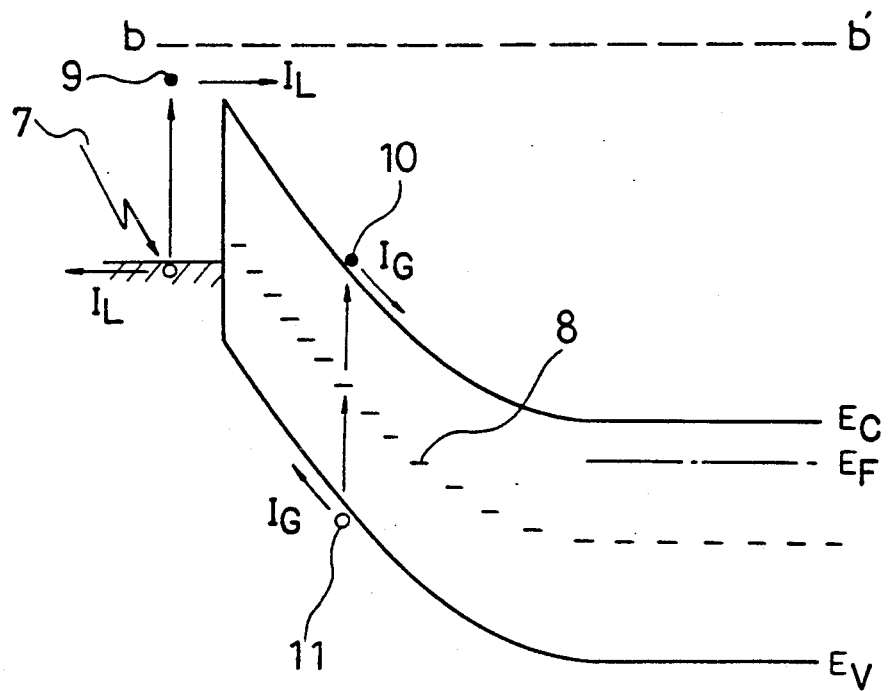
FIG. 7 is an energy-band diagram depicted along the broken line b—b' in FIG. 6.
Figure 8:
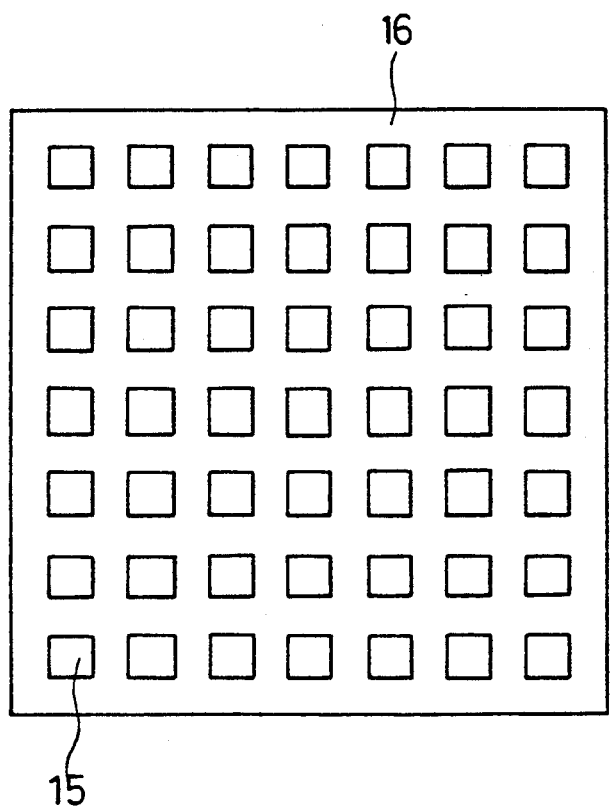
FIG. 8 is a plan view schematically showing a device in which semiconductor photodetectors are arranged in an array configuration, for explaining problems of the prior art semiconductor photodetector.

FIG. 2 is a diagram showing the energy bands depicted along the broken line a—a' in FIG. 1. In FIG. 2, the same reference numerals as those in FIG. 7 designate the same or corresponding parts. An electron 12 of the photoelectrons 9 which have entered toward the rear surface electrode side of the semiconductor substrate 1 recombines with a hole 13 at the interface between the n type $Si_{1-x}Ge_x$ layer 2 and the n type silicon layer 3, and at that time a recombination current $I_R$ is generated.

The above-described layers can be obtained by growing a SiGe layer continuously while varying the Ge composition ratio x by means of MBE or CVD.

The operation will be described.

The photoelectron 9 which is excited by incident light 7 in the metal film 4 has such a large kinetic energy that it enters the n type silicon passing over the Schottky barrier. The photoelectron 9 which has entered is accelerated by the electric field existing in the depletion layer toward the rear surface electrode side of the n type silicon substrate 1. On the other hand, the hole 11 which is generated by thermal excitation in the depletion layer, which broadens toward the n type semiconductor side is also accelerated by the electric field. However, the hole is stopped because the offset 14 in the valence band edge at the interface of the n type $Si_{1-x}Ge_x$ layer 2 and the n type silicon layer 3 which functions as an energy barrier. Therefore, a region which has holes in high concentration is produced at the offset 14.

The photoelectron 9 recombines with a hole 11 with a high probability when it passes through the positive hole high concentration region.

When the dark current $I_G$ which is thermally generated recombines in a proportion of $\alpha(0<\alpha\leq 1)$, the following formula is satisfied:

$$I_R = \alpha I_G \quad (0<\alpha\leq 1) \tag{3}$$

The total current I flowing through the Schottky junction is represented by the following formula:

$$I = I_L - I_R + I_G \tag{4}$$

From the formulae (3) and (4), $$I = I_L + (1-\alpha)I_G \quad (0<\alpha\leq 1) \tag{5}$$

Here, because $\alpha$ is a value in a range from 0 to 1, $(1-\alpha)$ is a value in a range from 0 to 1. Accordingly, it is found that the dark current $I_G$ decreases as compared with the formula (1) of the prior art device. Therefore, the dark current which causes noise can be suppressed.

The dark current can be suppressed more efficiently as the value $\alpha$ is closer to 1, and when the value $\alpha$ becomes 1, the dark current is zero and only the photocurrent $I_L$ exists. Accordingly, the dark current can be suppressed more effectively with increased offset.

Figure 5A:
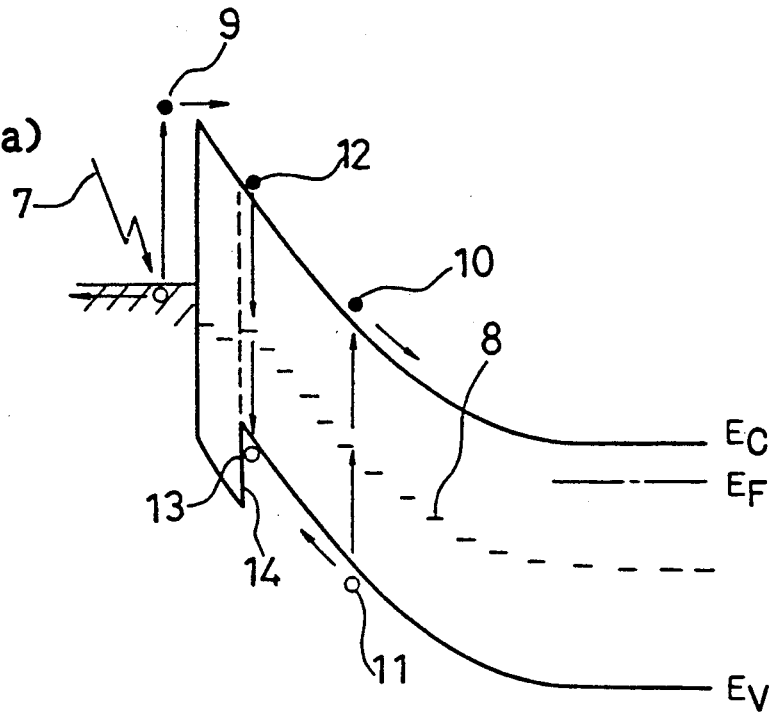
FIGS. 5(a) and 5(b) are energy-band diagrams of devices according to the other embodiments of the present invention.
Figure 5B:
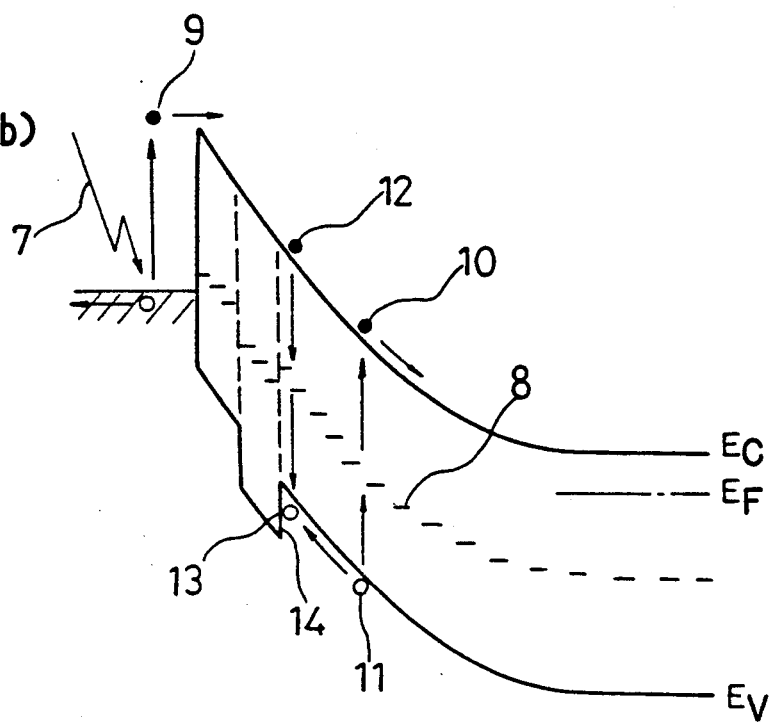

In the above-described embodiment, a semiconductor layer (n type $Si_{1-x}Ge_x$) 2 which has a narrower energy band gap than that of an n type silicon substrate 1 is used to generate an offset at the valence band edge. However, as shown in the two layer device of FIG. 5(a) and in a three layer device of FIG. 5(b), any kind of layer which has a broader energy band gap than that of n type silicon substrate 1 and which does not generate an offset which functions as energy barrier against photoelectrons 9 in the conductivity band edge and generates an offset which functions as energy barrier against positive hole in valence band edge can be used with the same effects.

Furthermore, in the above-described embodiment, p type can be used in place of n type if the valence band edge and that of conduction band edge are interchanged.

As is evident from the foregoing description, according to the semiconductor photodetector of the present invention, on the surface of semiconductor substrate is provided a semiconductor layer which has an energy band gap different from that of the substrate and functions as a barrier not against majority carriers but against minority carriers in the neighborhood of the Schottky junction portion and a metal layer is provided on this semiconductor layer. Therefore, noise in the detected signal can be suppressed by suppression of the dark current.

What is claimed is:

1. A semiconductor photodetector comprising:
   a first conductivity type semiconductor substrate of a first semiconductor material having a first energy band gap in which one of electrons and holes are majority charge carriers and the other of electrons and holes are minority charge carriers;
   a first conductivity type first semiconductor layer of a second semiconductor material having a second energy band gap disposed on said semiconductor substrate;
   a first conductivity type second semiconductor layer of a third semiconductor material having a third energy band gap at least as large as the first energy band gap disposed on and forming an interface with said first semiconductor layer; and
   a metal layer disposed on and producing a Schottky barrier junction with said second semiconductor layer and producing a charge depletion layer extending through said first and second semiconductor layers and into said semiconductor substrate, wherein the energy band gap of said first semiconductor layer at the interface of said first and second semiconductor layers is different from the energy band gap of said first semiconductor layer at said semiconductor substrate, no potential barrier to flow of majority charge carriers between said metal layer and said semiconductor substrate is produced at the interface of said first and second semiconductor layers, and a potential barrier to flow of minority charge carriers between said semiconductor substrate and said metal layer is produced at the interface of said first and second semiconductor layers.

2. A semiconductor photodetector as defined in claim 1 wherein said first conductivity type semiconductor substrate is n type silicon and said first semiconductor layer is an n type silicon germanium mixed crystal.

3. A semiconductor photodetector comprising:
   an n type conductivity type silicon substrate;
   an n type conductivity type $Si_{1-x}Ge_x$ layer disposed on said substrate wherein $0 < x < 1$;
   an n type conductivity type silicon layer disposed on said $Si_{1-x}Ge_x$ layer; and
   a metal layer disposed on said n type silicon layer and forming a Schottky barrier therewith.

4. The semiconductor photodetector as defined in claim 1 wherein the energy band gap of said first semiconductor layer is larger at said semiconductor substrate than at said second semiconductor layer.

5. The semiconductor photodetector as defined in claim 1 wherein the first and third energy band gaps are the same.

6. The semiconductor photodetector as defined in claim 2 wherein said second semiconductor layer is n type silicon.

7. The semiconductor photodetector as defined in claim 3 wherein x is smaller at said silicon substrate than at said silicon layer.

* * * * *